(12) United States Patent
Oh

(10) Patent No.: US 8,482,996 B2  
(45) Date of Patent: Jul. 9, 2013

(54) NONVOLATILE MEMORY APPARATUS WITH CHANGEABLE OPERATION SPEED AND RELATED SIGNAL CONTROL METHOD

(75) Inventor: Seung Min Oh, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 239 days.

(21) Appl. No.: 12/968,085

(22) Filed: Dec. 14, 2010

(65) Prior Publication Data

US 2012/0081981 A1 Apr. 5, 2012

(30) Foreign Application Priority Data

Sep. 30, 2010 (KR) ........................ 10-2010-0095078

(51) Int. Cl.
    *G11C 7/10* (2006.01)
    *G11C 7/00* (2006.01)

(52) U.S. Cl.
    USPC .......................................... 365/193; 365/191

(58) Field of Classification Search
    USPC ................................................. 365/193, 191
    See application file for complete search history.

(56) References Cited

U.S. PATENT DOCUMENTS

| 5,502,835 | A | 3/1996 | Le et al. |
| 6,026,465 | A | 2/2000 | Mills et al. |
| 6,400,611 | B1 | 6/2002 | Franklin et al. |
| 7,920,431 | B2 * | 4/2011 | Nobunaga et al. ....... 365/189.14 |
| 2009/0039927 | A1 * | 2/2009 | Gillingham et al. .......... 327/156 |

FOREIGN PATENT DOCUMENTS

| JP | 05-250263 | 9/1993 |
| JP | 2010020801 A | 1/2010 |
| KR | 1020030087922 A | 11/2003 |
| KR | 1020050003894 A | 1/2005 |
| KR | 1020070119378 A | 12/2007 |

* cited by examiner

*Primary Examiner* — Toan Le
*Assistant Examiner* — Hai Pham
(74) *Attorney, Agent, or Firm* — William Park & Associates Patent Ltd.

(57) ABSTRACT

Various embodiments of a nonvolatile memory apparatus configured to operate in a first operation mode and a second operation mode are disclosed. In one exemplary embodiment, the apparatus may include: a controller configured to enable complementary signal input/output buffers in response to a command for entry into the first operation mode and disable the complementary signal input/output buffers in response to a command for transition to the second operation mode while operating under the first operation mode.

31 Claims, 5 Drawing Sheets

NONVOLATILE MEMORY APPARATUS WITH CHANGEABLE OPERATION SPEED AND RELATED SIGNAL CONTROL METHOD

CROSS-REFERENCE TO RELATED APPLICATION

The present application claims priority under 35 U.S.C. §119(a) to Korean Patent Application No. 10-2010-0095078, filed on Sep. 30, 2010, in the Korean Intellectual Property Office, which is incorporated herein by reference in its entirety as if set forth in full.

BACKGROUND

1. Technical Field

Various embodiments of the present invention relate to a nonvolatile memory apparatus and, more particularly, to a nonvolatile memory apparatus with changeable operation speed and related is signal control methods.

2. Related Art

A flash memory apparatus is an example of a nonvolatile memory apparatus. In general, flash memory apparatuses are not separately developed for their intended use. Instead, the same flash memory apparatuses are used for a variety of applications. For example, unlike DRAMs, which are differently manufactured according to their applications (e.g., a mobile application, a graphic application, a main memory application, etc.), flash memory apparatuses use the same structure to apply to various applications. Accordingly, it is desirable for a flash memory apparatus to maintain not only a high speed operation protocol but also a low speed operation protocol.

FIG. 1 is a flow chart explaining a conventional method for operating a low speed flash memory apparatus. As power is applied to a flash memory apparatus (S101), the flash memory apparatus is set to a default mode (e.g., an asynchronous mode S103). Then, operations under the asynchronous mode, for example, reading, programming, and erasing, are performed (S105). Such a flash memory apparatus operating at a low speed includes a controller for controlling the entire operations and a flash memory module serving as a data storage region.

FIG. 2 is a diagram illustrating a conventional protocol for a low speed flash memory apparatus. As shown in FIG. 2, signals transmitted and received between a controller 110 and a flash memory module 120 may include a write enable signal /WE, an address latch enable signal ALE, a command latch enable signal CLE, a read enable signal /RE, input/output data IO<0:N>, a state checking signal /RB, a chip enable signal /CE, and a write protect signal /WP. The protocol of FIG. 2 is appropriate for a low speed operation. For a high speed operation, signals for synchronizing signals between a controller and a flash memory module are needed.

FIG. 3 is a diagram illustrating a conventional protocol for a flash memory apparatus that can change its operation speed. Referring to FIG. 3, a clock signal CLK and a data strobe signal DQS are introduced to apply the same flash memory apparatus to not only a low speed application but also a high speed application. In such a flash memory apparatus, when entering a synchronous mode (i.e., a synchronous mode), a pin for transmitting a write enable signal /WE is set as a pin for transmitting clock signal CLK, and a pin for transmitting a read enable signal /RE is set as a pin for transmitting a write signal /WR. Signals between a controller 210 and a flash memory module 220 are synchronized using clock signal CLK, and input/output data are strobed using data strobe signal DQS. In this way, the flash memory apparatus operates under a high speed mode.

The terms "synchronous mode" and "asynchronous mode," as used herein, refer to, for example, a high speed operation mode and a low speed operation mode, respectively.

In a flash memory apparatus, conversion between a synchronous mode and an asynchronous mode is accomplished by a set feature command. The term "set feature," as used herein, may refer to a command used to change an internal operation of a flash memory apparatus according to a user's desire. The asynchronous mode is the default mode, and if the set feature for conversion into the synchronous mode is inputted, the flash memory apparatus is converted into the synchronous mode. To convert into the synchronous mode, the pin used for transmission of write enable signal /WE in an asynchronous mode is converted into the pin for clock signal CLK, and the pin used for transmission of read enable signal /RE is converted into the pin for the write signal /WR. Moreover, a pin for transmitting data strobe signal DQS is enabled.

As such, while clock signal CLK and data strobe signal DQS are selectively used to support both the asynchronous mode and the synchronous mode, a further speed increase required by an application may narrow the data eye and, as a result, may result in an increased signal noise that may cause a failure.

In order to minimize the influences of narrowness of the data eye and the signal noise, complementary signals are needed. While the complementary signals play an important role of suppressing a noise effect of a signal, they may increase current consumption by twice or more when used. Accordingly, the set feature is established such that the complementary signals are used not in the asynchronous mode but in the synchronous mode.

FIG. 4 is a diagram illustrating a conventional protocol for another flash memory apparatus whose operation speed is changeable and where complementary signals are added. Referring to FIG. 4, a complementary clock signal /CLK and a complementary data strobe signal /DQS are added as complementary of signals transmitted and received between a controller 310 and a flash memory module 320.

After the flash memory apparatus is converted into a synchronous mode, if a set feature for enabling the complementary signals is inputted, buffers for inputting/outputting the complementary clock signal /CLK and the complementary data strobe signal /DQS are enabled so that a noise effect may be reduced by the complementary signals.

Conversion from the synchronous mode to an asynchronous mode is accomplished by a set feature for enabling conversion into an asynchronous mode. Since it is efficient not to use the complementary signals in the asynchronous mode, a set feature for disabling the complementary signals is separately inputted. Thus, in a currently-used flash memory apparatus, the complementary signals are continuously maintained in an enabled state even after the flash memory apparatus is converted from the synchronous mode into the asynchronous mode, and a separate set feature should be used to disable the complementary signals.

Consequently, the complementary signals are maintained in the enabled state until the set feature for disabling the complementary signals is inputted. Therefore, operation current consumption of the flash memory apparatus increases.

SUMMARY

Accordingly, there is a need for an improved nonvolatile memory apparatus that may obviate one or more of the above-mentioned problems or disadvantages. It should be understood, however, that some aspects of the invention may not necessarily obviate all of the problems or disadvantages mentioned above.

In the following description, certain aspects and embodiments will become evident. It should be understood that these aspects and embodiments are merely exemplary, and the invention, in its broadest sense, could be practiced without having one or more features of these aspects and embodiments.

To attain the advantages and in accordance with the purpose of the invention, as embodied and broadly described herein, one aspect of the invention may provide a nonvolatile memory apparatus configured to operate in a first operation mode and a second operation mode. The nonvolatile memory apparatus may include: a controller configured to enable complementary signal input/output buffers in response to a first command for entry into the first operation mode and disable the complementary signal input/output buffers in response to a second command for transition to the second operation mode while operating under the first operation mode.

In another exemplary aspect of the present invention, a nonvolatile memory apparatus may include: a controller comprising first complementary signal input/output buffers; and a nonvolatile memory module configured to serve as a data storage region and comprising second complementary signal input/output buffers controllable by the controller, wherein the controller is configured to enable the first and second complementary signal input/output buffers when entering a first operation mode and to disable the first and second complementary signal input/output buffers in response to a command for transition to a second operation mode while operating under the first operation mode.

Some exemplary aspects may provide a method for controlling complementary signals in a nonvolatile memory apparatus comprising a controller and a nonvolatile memory module controllable by the controller. The method may include: enabling complementary signals by the controller in response to a command for entry into a first operation mode; and disabling the complementary signals by the controller in response to a command for transition to a second operation mode.

According to another exemplary aspect, a method for controlling complementary signals in a nonvolatile memory apparatus comprising a controller and a nonvolatile memory module controllable by the controller, may comprise: entering a second operation mode when power is supplied; entering a first operation mode when the controller enables complementary signals in response to a command for entry into the first operation mode; disabling the complementary signals by the controller in response to a command for transition to the second operation mode while operating in the first operation mode; and entering the second operation mode.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
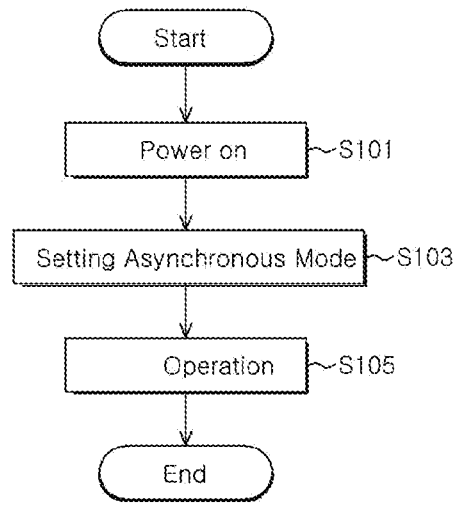
FIG. 1 is a flow chart explaining a conventional method for operating a low speed flash memory apparatus.
Figure 2:
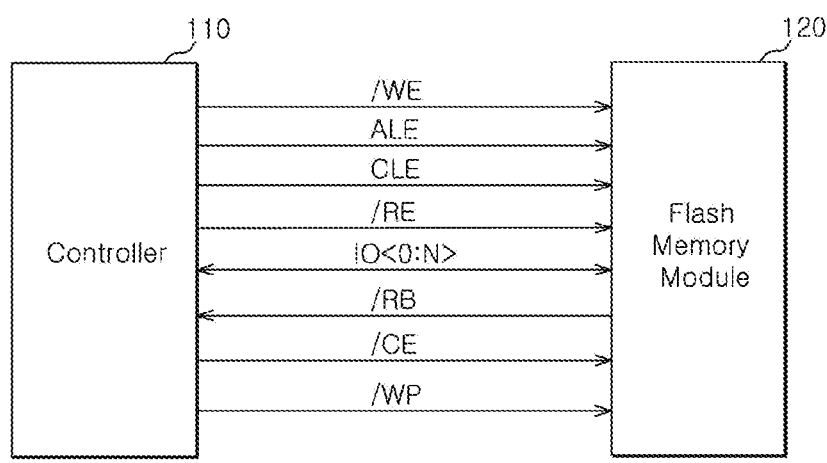
FIG. 2 is a diagram illustrating a conventional protocol for a low speed flash memory apparatus.
Figure 3:
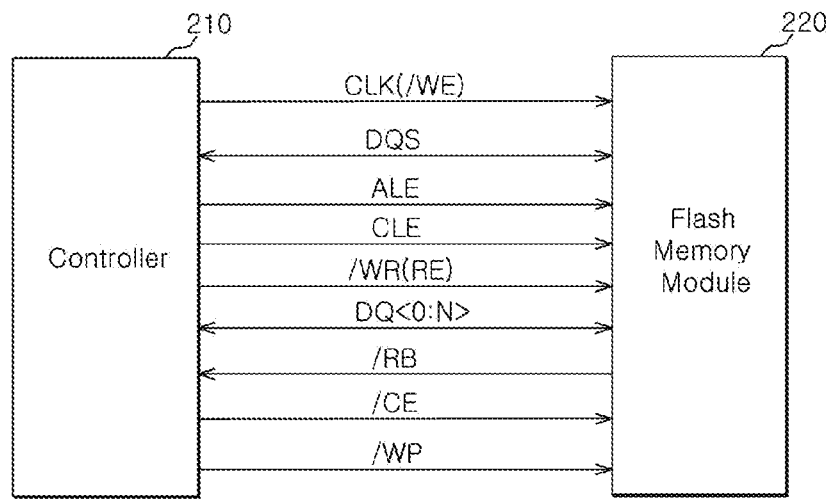
FIG. 3 is a diagram illustrating a conventional protocol for a flash memory apparatus that can change an operation speed thereof.
Figure 4:
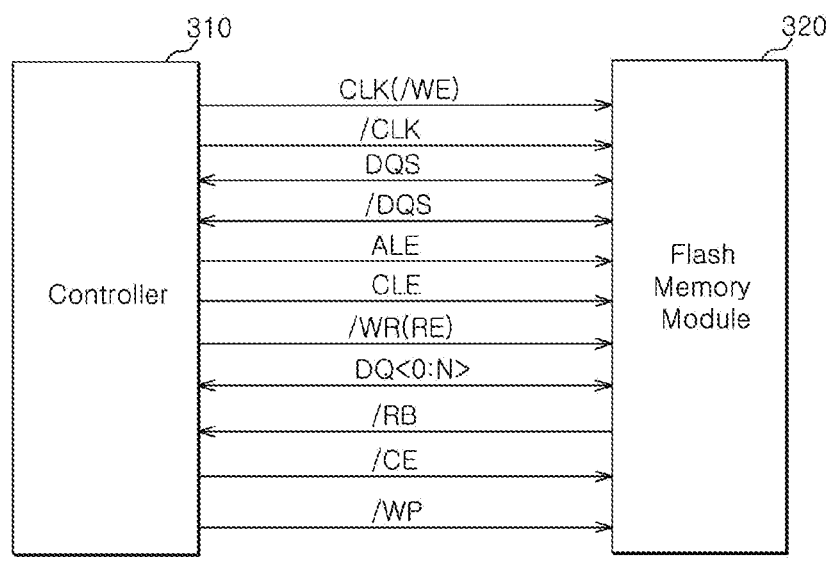
FIG. 4 is a diagram illustrating a conventional protocol for another flash memory apparatus.

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 5:
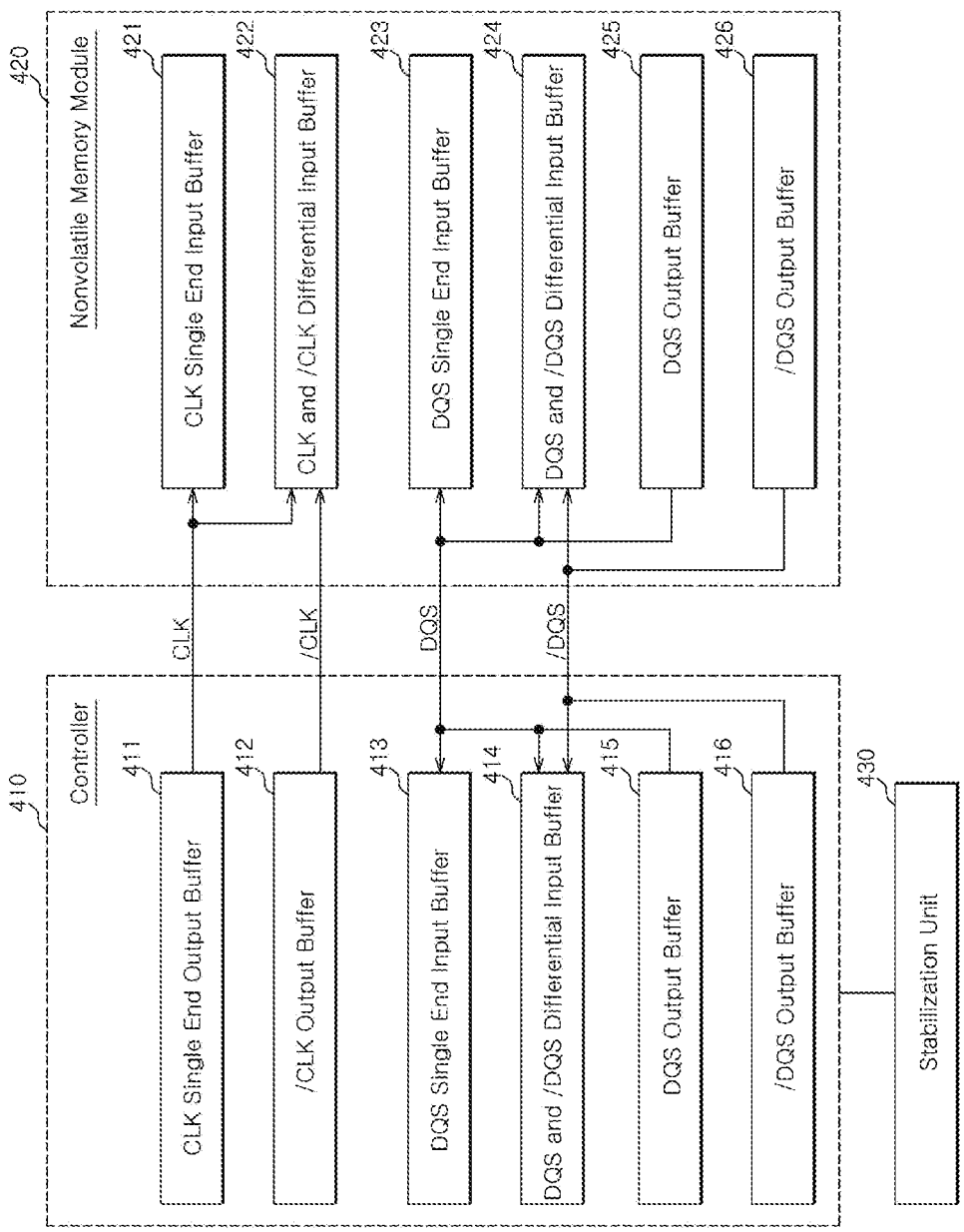
FIG. 5 is a schematic diagram illustrating a nonvolatile memory apparatus in accordance with an exemplary embodiment.

FIG. 5 is a schematic diagram illustrating a nonvolatile memory apparatus in accordance with an exemplary embodiment of the present invention. The nonvolatile memory apparatus of FIG. 5 includes a controller 410 for controlling the operations and a nonvolatile memory module 420 for storing data. Controller 410 controls the operations of memory module 420.

Controller 410 is configured to support both a low speed mode and a high speed mode. For example, controller 410 may have first complementary signal input/output buffers 411, 412, 413, 414, 415 and 416, and nonvolatile memory module 420 may have second complementary signal input/output buffers 421, 422, 423, 424, 425 and 426, which are controlled by controller 410.

The first complementary signal input/output buffers may include: output buffers 411 and 412 for a clock signal and a complementary clock signal; and input/output buffers 413, 414, 415 and 416 for a data strobe signal and a complementary data strobe signal.

Output buffer 411 for a clock signal may be configured as a single-end type, and the input buffers for data strobe signals may include a data strobe signal single-end input buffer 413 and a differential input buffer 414 for a data strobe signal and a complementary data strobe signal.

In a synchronous mode where the nonvolatile memory apparatus operates at a high speed, a pin, which is used to transmit a write enable signal (/WE) in a low speed operation, may be used for outputting a clock signal (CLK), and a pin, which is used to transmit a read enable signal (/RE) in the low speed operation, may be used for transmitting a write signal (/WR). When the nonvolatile memory apparatus enters the synchronous mode, output buffer 412 for a complementary clock signal, differential input buffer 414 for a data strobe signal and a complementary data strobe signal, output buffer 415 for a data strobe signal, and output buffer 416 for a complementary data strobe signal are enabled, and data strobe signal single-end input buffer 413 is disabled.

The second complementary signal input/output buffers may include input buffers 421 and 422 for a clock signal and a complementary clock signal, and input/output buffers 423, 424, 425 and 426 for a data strobe signal and a complementary data strobe signal.

Input buffers 421 and 422 may comprise a clock signal single-end input buffer 421 and a differential input buffer 422 for a clock signal and a complementary clock signal. Input/output buffers 423, 424, 425, and 426 may comprise a data strobe signal single-end input buffer 423 and a differential input buffer 424 for a data strobe signal and a complementary data strobe signal.

When the nonvolatile memory apparatus enters the synchronous mode in which the nonvolatile memory apparatus operates at the high speed, differential input buffer 422 for a clock signal and a complementary clock signal, differential input buffer 424 for a data strobe signal and a complementary data strobe signal, output buffer 425 for a data strobe signal, and output buffer 426 for a complementary data strobe signal are enabled, while clock signal single-end input buffer 421 and data strobe signal single-end input buffer 413 are disabled.

As a result, in the synchronous mode, a clock signal and a complementary clock signal, which are outputted from clock signal single-end output buffer 411 and output buffer 412, are inputted to differential input buffer 422 signal of the nonvolatile memory module 420.

Further, differential input buffer 414 of the controller 410 receives a data strobe signal and a complementary data strobe signal from data strobe signal output buffer 425 and output buffer 426 of the nonvolatile memory module 420.

Differential input buffer 424 for a data strobe signal and a complementary data strobe signal of the nonvolatile memory module 420 receives a data strobe signal and a complementary data strobe signal from output buffer 415 and output buffer 416 of the controller 410.

In general, a nonvolatile memory apparatus is configured to operate under an asynchronous mode when powered on. Thus, a separate, preset feature is inputted for conversion into a synchronous mode. When the set feature is inputted for entry into a synchronous mode, controller 410 enables the complementary signal input/output buffers necessary for synchronous mode operations, as described above. Thus, signals transmitted and received between controller 410 and nonvolatile memory module 420 can be synchronized, and influences by signal noise in a high speed operation can be minimized.

In the exemplary embodiment of FIG. 5, the nonvolatile memory apparatus further includes a stabilization unit 430. For example, after the set feature for entry into the synchronous mode is inputted, stabilization unit 430 may maintain the nonvolatile memory apparatus in a standby state for a predetermined time to stabilize the nonvolatile memory apparatus. By setting an operation speed and enabling necessary complementary signals after the nonvolatile memory apparatus is stabilized, the nonvolatile memory apparatus can be prevented from operating at a high speed before the complementary signals are enabled.

A nonvolatile memory apparatus may cause a failure or error if it operates at a high speed with the complementary signals disabled. Since the nonvolatile memory apparatus of the disclosed embodiment is configured to operate at a high speed after maintaining a standby state for a predetermined time to be stabilized, various factors that may cause a defect may be eliminated.

Figure 6:
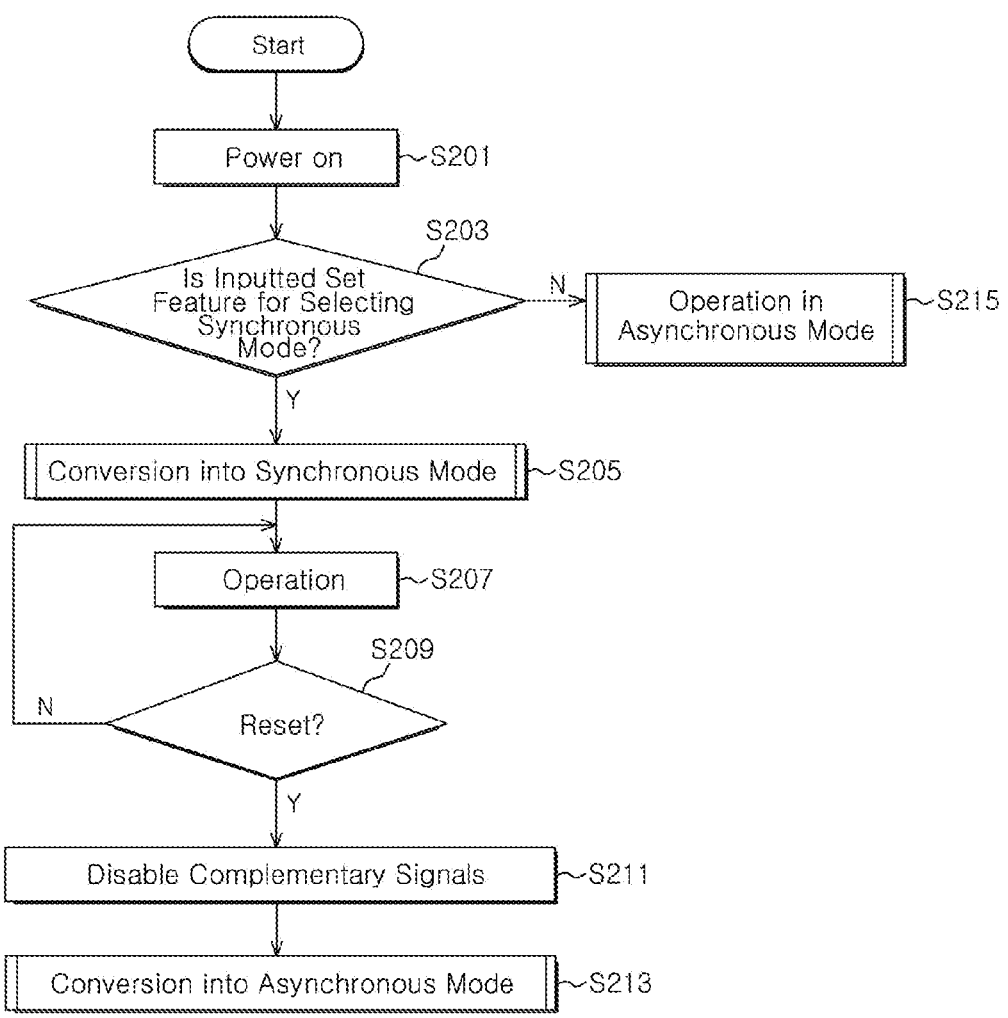
FIG. 6 is a flow chart explaining a complementary signal control method in accordance with one exemplary embodiment.

FIG. 6 is a flow chart explaining a method for controlling complementary signal according to another exemplary embodiment.

As power is supplied to a nonvolatile memory apparatus at step S201, the nonvolatile memory apparatus is set to a default mode (e.g., an asynchronous mode). In this state, as a set feature for entry into the synchronous mode is inputted at step S203, controller 410 converts the nonvolatile memory apparatus into the synchronous mode at step S205 by, for example, enabling complementary signals, and one or more operations (including erasing, programming, and/or reading) are performed at step S207.

Thereafter, if a reset command (e.g., a command for transition to the asynchronous mode) is inputted at step S209, controller 410 disables the complementary signals at step S211, and then converts the nonvolatile memory apparatus into the asynchronous mode at step S213.

If the set feature for entry into the synchronous mode is not inputted in step S203, the nonvolatile memory apparatus operates under the asynchronous mode at step S215 as the default mode.

Figure 7:
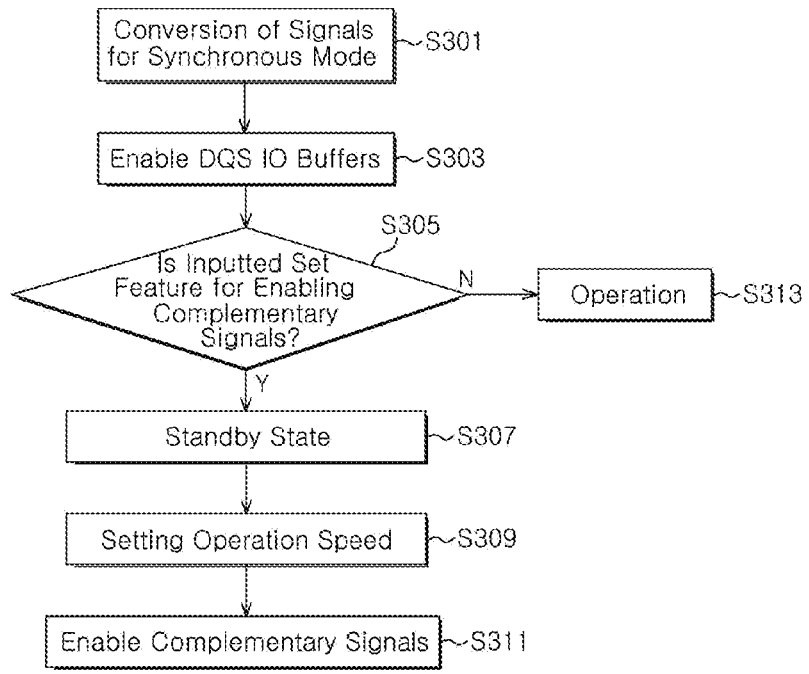
FIG. 7 is a flow chart explaining an exemplary method for converting an asynchronous mode into a synchronous mode in the method shown in FIG. 6.

FIG. 7 is a flow chart explaining an exemplary method for converting the asynchronous mode into the synchronous mode shown in FIG. 6.

When entry into the synchronous mode is requested through the set feature, controller 410 first reconfigures the signals, among all signals used in the asynchronous mode, whose purposes are to be changed in the synchronous mode at step S301. For example, the pin for transmitting the write enable signal (/WE) is converted into the pin for transmitting the clock signal (CLK), and the pin for transmitting the read enable signal /RE is converted into the pin for transmitting the write signal (/WR). Further, controller 410 enables data strobe signal input/output buffers 413, 415, 423 and 425 at step S303. As a result, the clock signal (CLK) and the data strobe signal (DQS) are enabled through the steps S301 and S303.

Thereafter, when the set feature for enabling respective complementary clock signal (CLK) and data strobe signal (DQS) is inputted at step S305, controller 410 enables the complementary signals at step S311. For example, according to one exemplary embodiment, controller 410 may enable buffers 412 and 422 for inputting/outputting a complementary clock signal (/CLK). Controller 410 may also enable buffers 414, 416, 424 and 426 for inputting/outputting a complementary data strobe signal (/DQS). In addition, controller 410 may disable data strobe signal single-end input buffers 413 and 423 and clock signal single-end input buffer 421, such that the clock signal, the complementary clock signal, the data strobe signal, and the complementary data strobe signal can be transmitted to one another by differential input buffers 422, 414 and 424.

In some exemplary embodiments, before enabling the complementary signals by controller 410, at step S307, the nonvolatile memory apparatus can be maintained at the standby state by stabilization unit 430 for a predetermined time. After lapse of the predetermined time, by setting the operation speed of the nonvolatile memory apparatus (at step S309) and enabling the complementary signals (at step S311), it may be possible to eradicate various failure modes caused by operating the nonvolatile memory apparatus at an excessive speed before the complementary signals are enabled.

If the set feature for enabling the complementary signals is not inputted in step S305, the nonvolatile memory apparatus operates in a state where only clock signal input/output buffers 411 and 421 and data strobe signal input/output buffers 413, 415, 423 and 425 are enabled (step S313). Even in this case, the nonvolatile memory apparatus can be converted into the asynchronous mode if the reset command is inputted. This will be described below with reference to FIG. 8.

Figure 8:
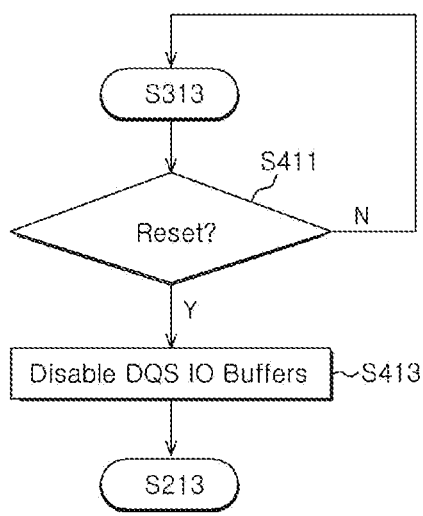
FIG. 8 is a flow chart explaining a complementary signal control method in accordance with another exemplary embodiment.

FIG. 8 is a flow chart explaining a complementary signal control method according to one exemplary embodiment.

At step S313, a reset command can be inputted when the nonvolatile memory apparatus is operating in an asynchronous mode with only clock signal input/output buffers 411 and 421 and data strobe signal input/output buffers 413, 415, 423 and 425 enabled.

In response to the reset command, at step S213, controller 410 disables the data strobe signal input/output buffers, which have been enabled in step S303, and converts to an asynchronous mode. For example, controller 410 disables data strobe signal single-end input buffers 413 and 423 and output buffers 416 and 426 shown in FIG. 5.

At step S213, for complete conversion into the asynchronous mode, the pin for transmitting the clock signal (CLK) may be converted back to the pin for transmitting the write enable signal (/WE), and the pin for transmitting the write signal (/WR) may be converted back to the pin for transmitting the read enable signal (/RE).

After the complementary signals are enabled as in step S311, if the reset command (e.g., the command for transition to the asynchronous mode) is inputted as in the step S209 of FIG. 6, controller 410 disables output buffer 412 for a complementary clock signal, differential input buffer 414 for a data strobe signal and a complementary data strobe signal, data strobe signal output buffer 415 and output buffer 416 for a complementary data strobe signal, and enable data strobe signal single-end input buffer 413.

Further, in the nonvolatile memory module 420, differential input buffer 422 for a clock signal and a complementary clock signal, differential input buffer 424 for a data strobe signal and a complementary data strobe signal, data strobe signal output buffer 425 and output buffer 426 for a complementary data strobe signal are disabled, and clock signal single-end input buffer 421 and data strobe signal single-end input buffer 423 are enabled.

Moreover, in order for conversion into the asynchronous mode, the pin for transmitting the clock signal (CLK) is converted again into the pin for transmitting the write enable signal (/WE), and the pin for transmitting the write signal (/WR) is converted again into the pin for transmitting the read enable signal (/RE).

As is apparent from the above descriptions, various embodiments of the present invention uses a reset command (FF, a hex code), rather than a set feature, to disable complementary signals. In other words, while operating under a synchronous mode, if the reset command is inputted, the complementary signals are immediately disabled. Consequently, it may be possible to shorten a time for which the complementary signals are unnecessarily enabled.

While the complementary signals remove noise from signals and thus are advantageous in a high speed operation, they tend to increase current consumption. Accordingly, when entering a low speed mode that does not require the complementary signals, the complementary signals are immediately disabled to minimize the operation current of a nonvolatile memory apparatus.

Further, when entering the synchronous mode, enabling the complementary signals after a predetermined standby period may prevent situations where the nonvolatile memory apparatus is operated at an excessive speed before the complementary signals are enabled, which may lead to defects. Consequently, the reliability of the nonvolatile memory apparatus can be improved.

While certain embodiments have been described above, it will be understood to those skilled in the art that the embodiments described are by way of example only. Accordingly, the nonvolatile memory apparatus and related signal control method described herein should not be limited to the described embodiments. Rather, the nonvolatile memory apparatus and the related signal control method described herein should only be limited in light of the claims that follow when taken in conjunction with the above description and accompanying drawings.

What is claimed is:

1. A nonvolatile memory apparatus configured to operate in a first operation mode and a second operation mode, comprising:
a controller configured to enable buffers which input or output complementary signal in response to a first command for entry into the first operation mode and disable the buffers in response to a second command for transition to the second operation mode while operating under the first operation mode,
wherein the first command is a set feature command, and the second command is a reset command.

2. The nonvolatile memory apparatus according to claim 1, wherein the controller comprises an output buffer for a clock signal, an output buffer for a complementary clock signal, input/output buffers for a first data strobe signal and input/output buffers for a complementary first data strobe signal.

3. The nonvolatile memory apparatus according to claim 1, further comprising:
a nonvolatile memory module configured to serve as a data storage region controllable by the controller, and
wherein the nonvolatile memory module comprises an input buffer for a clock signal, an input buffer for a complementary clock signal, input/output buffers for a second data strobe signal, and input/output buffers for a complementary second data strobe signal.

4. The nonvolatile memory apparatus according to claim 1, further comprising:
a stabilization unit configured to maintain the nonvolatile memory apparatus in a standby state for a predetermined time period in response to the first command,
wherein the controller is configured to enable the buffers after lapse of the predetermined time period.

5. The nonvolatile memory apparatus according to claim 4, wherein the controller enables the buffers after setting an operation speed when the predetermined time period elapses.

6. A nonvolatile memory apparatus comprising:
a controller comprising first buffers which input or output complementary signal; and
a nonvolatile memory module configured to serve as a data storage region and comprising second buffers which input or output complementary signal controllable by the controller,
wherein the controller is configured to enable the first and second buffers when entering a first operation mode and to disable the first and second buffers in response to a reset command for transition to a second operation mode while operating under the first operation mode.

7. The nonvolatile memory apparatus according to claim 6, wherein the first operation mode is a synchronous mode.

8. The nonvolatile memory apparatus according to claim 7, wherein the second operation mode is an asynchronous mode.

9. The nonvolatile memory apparatus according to claim 6, wherein the first buffers comprise an output buffer for a clock signal, an output buffer for a complementary clock signal, input/output buffers for a first data strobe signal, and input/output buffers for a complementary first data strobe signal.

10. The nonvolatile memory apparatus according to claim 9, wherein the input buffer for the first data strobe signal and the input buffer for the complementary first data strobe signal comprise a differential input buffer for a data strobe signal and a complementary data strobe signal.

11. The nonvolatile memory apparatus according to claim 10, wherein the controller further comprises a first data strobe signal single-end input buffer, wherein the controller is configured to disable the first data strobe signal single-end input buffer in the first operation mode.

12. The nonvolatile memory apparatus according to claim 11, wherein the controller is configured to enable the first data strobe signal single-end input buffer in response to the command for transition to the second operation mode.

13. The nonvolatile memory apparatus according to claim 9, wherein the second buffers comprise an input buffer for a clock signal, input/output buffers for a second data strobe signal, and input/output buffers for a complementary second data strobe signal.

14. The nonvolatile memory apparatus according to claim 13, wherein the input buffer for the clock signal comprises a differential input buffer for the clock signal and a complementary clock signal.

15. The nonvolatile memory apparatus according to claim 14, wherein the input buffer for the second data strobe signal and the input buffer for the complementary second data strobe signal comprise a differential input buffer for a data strobe signal and a complementary data strobe signal.

16. The nonvolatile memory apparatus according to claim 15, wherein the nonvolatile memory module further comprises a second data strobe signal single-end input buffer, wherein the controller is configured to disable the second data strobe signal single-end input buffer in the first operation mode.

17. The nonvolatile memory apparatus according to claim 16, wherein the controller is configured to enable the second data strobe signal single-end input buffer in response to the command for transition to the second operation mode.

18. The nonvolatile memory apparatus according to claim 15, wherein the nonvolatile memory module further comprises a clock signal single-end input buffer, wherein the controller is configured to disable the clock signal single-end input buffer in the first operation mode.

19. The nonvolatile memory apparatus according to claim 18, wherein the controller is configured to enable the clock signal single-end input buffer in response to the command for transition to the second operation mode.

20. The nonvolatile memory apparatus according to claim 6, further comprising a stabilization unit configured to maintain the nonvolatile memory apparatus in a standby state for a predetermined time period in response to a command for entry into the first operation mode.

21. The nonvolatile memory apparatus according to claim 20, wherein the controller is configured to enable the first and second buffers after lapse of the predetermined time period by the stabilization unit.

22. The nonvolatile memory apparatus according to claim 21, wherein the controller is configured to enable the first and second buffers after setting an operation speed when the predetermined time period elapses.

23. A method for controlling complementary signals in a nonvolatile memory apparatus comprising a controller and a nonvolatile memory module controllable by the controller, the method comprising:
enabling complementary signals by the controller in response to a first command for entry into a first operation mode; and
disabling the complementary signals by the controller in response to a second command for transition to a second operation mode,
wherein the first command is a set feature command, and the second command is a reset command.

24. The method according to claim 23, wherein enabling complementary signals comprises maintaining the nonvolatile memory apparatus in a standby state for a predetermined time period in response to the command for entry to the first operation mode.

25. The method according to claim 24, further comprising setting an operation speed when the predetermined time period elapses prior to enabling the complementary signals.

26. The method according to claim 23, wherein enabling the complementary signals comprises enabling a clock signal, a complementary clock signal, a data strobe signal, and a complementary data strobe signal.

27. A method for controlling complementary signals in a nonvolatile memory apparatus comprising a controller and a nonvolatile memory module controllable by the controller, the method comprising:
entering a second operation mode when power is supplied;
entering a first operation mode when the controller enables complementary signals in response to a command for entry into the first operation mode;
disabling the complementary signals by the controller in response to a reset command for transition to the second operation mode while operating in the first operation mode; and
entering the second operation mode.

28. The method according to claim 27, wherein the first operation mode is a synchronous mode.

29. The method according to claim 27, wherein the second operation mode is an asynchronous mode.

30. The method according to claim 27, wherein the complementary signals comprise a clock signal, a complementary clock signal, a data strobe signal, and a complementary data strobe signal.

31. The method according to claim 27, wherein entering the first operation mode comprises:
maintaining the nonvolatile memory apparatus in a standby state for a predetermined time period in response to the command for entry to the first operation mode;
setting an operation speed; and
enabling the complementary signals.

* * * * *